United States Patent [19]
Ries et al.

[11] Patent Number: 5,792,273
[45] Date of Patent: Aug. 11, 1998

[54] SECONDARY EDGE REFLECTOR FOR HORIZONTAL REACTOR

[75] Inventors: Michael J. Ries, St. Charles; Lance G. Hellwig, Jennings; Jon A. Rossi, Chesterfield, all of Mo.

[73] Assignee: MEMC Electric Materials, Inc., St. Peters, Mo.

[21] Appl. No.: 863,960

[22] Filed: May 27, 1997

[51] Int. Cl.$^6$ .................................................. C23C 16/00
[52] U.S. Cl. ............................ 118/725; 392/411; 392/420
[58] Field of Search ............................ 118/725; 392/411, 392/420

*Primary Examiner*—Richard Bueker
*Attorney, Agent, or Firm*—Senniger, Powers, Leavitt & Roedel

[57] ABSTRACT

A horizontal reactor for depositing an epitaxial layer on a semiconductor wafer. The reactor includes a reaction chamber sized and shaped for receiving the semiconductor wafer and a susceptor having an outer edge and a generally planar wafer receiving surface positioned in the reaction chamber for supporting the semiconductor wafer. In addition, the reactor includes a heating array positioned outside the reaction chamber including a plurality of heat lamps and a primary reflector for directing thermal radiation emitted by the heat lamps toward the susceptor to heat the semiconductor wafer and susceptor. Further, the reactor includes a secondary edge reflector having a specular surface positioned beside the heating array for recovering misdirected thermal radiation directed generally to a side of the heating array and away from the susceptor. The secondary edge reflector is shaped and arranged with respect to the heating array and the susceptor for re-directing the misdirected thermal radiation to the outer edge of the susceptor. Thus, the secondary edge reflector heats the edge and reduces thermal gradients across the susceptor and the semiconductor wafer to inhibit slip dislocations in the wafer during epitaxial layer deposition.

14 Claims, 5 Drawing Sheets

5,792,273

SECONDARY EDGE REFLECTOR FOR HORIZONTAL REACTOR

BACKGROUND OF THE INVENTION

This invention relates generally to a horizontal reactor for depositing an epitaxial layer on a semiconductor wafer, and more particularly to a reactor having a secondary reflector for recovering misdirected thermal radiation and re-directing the recovered radiation toward an outer edge of a susceptor supporting the semiconductor wafer to heat the edge and inhibit slip dislocations in the wafer during epitaxial layer deposition.

Conventional horizontal reactors comprise a quartz reaction chamber which extends horizontally between an entrance for admitting reactive gas to the chamber and an exit for venting reactive gas from the chamber. A susceptor positioned in the reaction chamber has a generally planar wafer receiving surface for supporting the semiconductor wafer during the chemical vapor deposition process. Heating arrays positioned above and below the reaction chamber heat the semiconductor wafer and susceptor. Each array comprises a plurality of infrared heat lamps and one or more reflectors for directing thermal radiation emitted by the heat lamps toward the susceptor to heat the wafer and susceptor.

It is important to maintain a uniform temperature distribution across the wafer during chemical vapor deposition to avoid wafer defects known as slip dislocations. If the temperature varies across the wafer, stresses develop in the wafer, and if these stresses become great enough, a slip dislocation can occur. Slip dislocations cause steps on the faces of the wafer. However, the faces of semiconductor wafers must be extremely smooth and flat so electronic circuits may be printed on them by electron beam lithography or photolithography. Flatness is critical to maintain resolution of the printed lines which can be as narrow as one micron or less. Slip dislocation defects cannot be removed. If a slip dislocation occurs, the wafer must be discarded. Therefore, slip dislocation defects must be avoided during epitaxial layer deposition.

Moreover, the thickness and resistivity of the epitaxial layer varies as a function of wafer temperature during chemical vapor deposition. Uniform epitaxial layer thickness and resistivity are required to produce semiconductors having desirable properties from the wafers. Thus, a uniform wafer temperature must be maintained during chemical vapor deposition.

Because the edge of the susceptor has a greater surface area per unit volume than other portions of the susceptor, more heat energy is lost from the edge due to radiation and convection. If the energy losses are not compensated for either by directing additional energy toward the edge or by reducing losses, the edge of the susceptor will be cooler than the middle of the susceptor. Since the wafer is laid directly on the susceptor, the wafer and susceptor are in thermal communication. Thus, heat is lost from the wafer through the susceptor. Further, if the edge of the susceptor is cooler than its middle, the edge of the wafer will be cooler than the middle which, as explained above, can result in slip dislocations thereby yielding unacceptable wafers.

In order to reduce the amount of energy lost at the edge of the susceptor and to alleviate the defects caused from the lost energy, heat shields and heat lamps have been arranged to reduce heat loss and concentrate thermal energy at the edges of the susceptor. Although these measures have been successful to varying degrees in preventing slip dislocations, still more can be done to reduce thermal gradients across the susceptor.

SUMMARY OF THE INVENTION

Among the several objects and features of the present invention may be noted the provision of a reactor wherein thermal gradients across wafers are reduced during chemical vapor deposition; the provision of such a reactor which produces wafers having fewer slip dislocation defects; the provision of a reactor which more efficiently heats wafers; and the provision of a reactor which re-directs misdirected thermal energy toward areas of greatest heat loss.

Briefly, apparatus of this invention is a horizontal reactor for depositing an epitaxial layer on a semiconductor wafer. The reactor comprises a reaction chamber sized and shaped for receiving the semiconductor wafer and a susceptor having an outer edge and a generally planar wafer receiving surface positioned in the reaction chamber for supporting the semiconductor wafer. In addition, the reactor comprises a heating array positioned outside the reaction chamber comprising a plurality of heat lamps and a primary reflector for directing thermal radiation emitted by the heat lamps toward the susceptor to heat the semiconductor wafer and susceptor. Further, the reactor comprises a secondary edge reflector having a specular surface positioned beside the heating array for recovering misdirected thermal radiation directed generally to a side of the heating array and away from the susceptor. The secondary edge reflector is shaped and arranged with respect to the heating array and the susceptor for re-directing the misdirected thermal radiation to the outer edge of the susceptor. Thus, the secondary edge reflector heats the edge and reduces thermal gradients across the susceptor and the semiconductor wafer to inhibit slip dislocations in the wafer during epitaxial layer deposition.

Other objects and features of the invention will be in part apparent and in part pointed out hereinafter.

BRIEF DESCRIPTION OF THE DRAWINGS

Corresponding reference characters indicate corresponding parts throughout the several views of the drawings.

DETAILED DESCRIPTION OF THE PREFERRED EMBODIMENT

Figure 1:
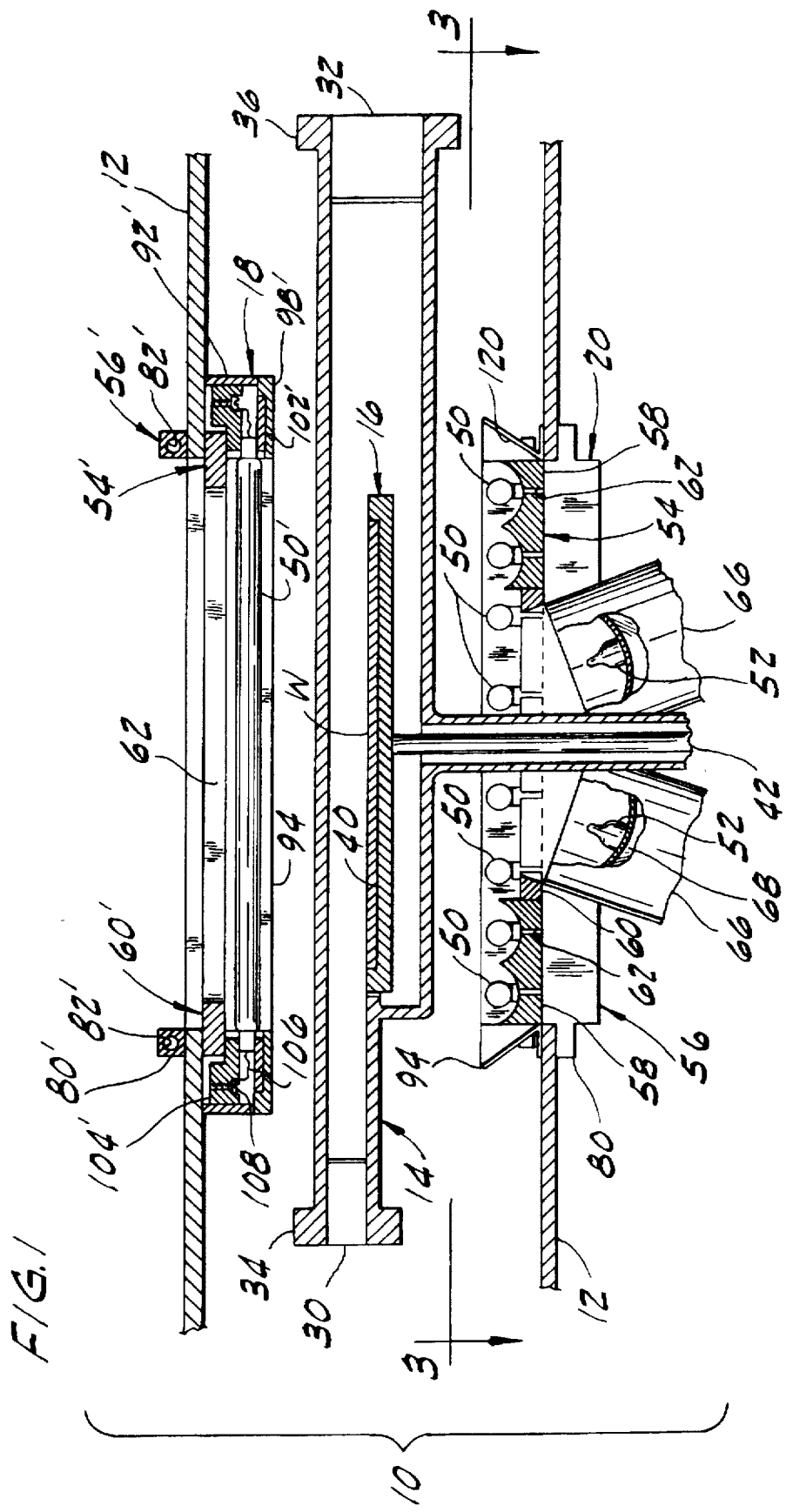
FIG. 1 is a schematic vertical section of a horizontal reactor of the present invention for depositing an epitaxial layer on a semiconductor wafer.

Referring now to the drawings and in particular to FIG. 1, a horizontal reactor for depositing an epitaxial layer on a semiconductor wafer W is identified in its entirety by the reference numeral 10. The reactor is housed in an enclosure 12 (partially shown) and generally comprises a reaction chamber (generally designated 14), a susceptor (generally designated 16), an upper heating array (generally designated 18), and a lower heating array (generally designated 20).

Figure 2:
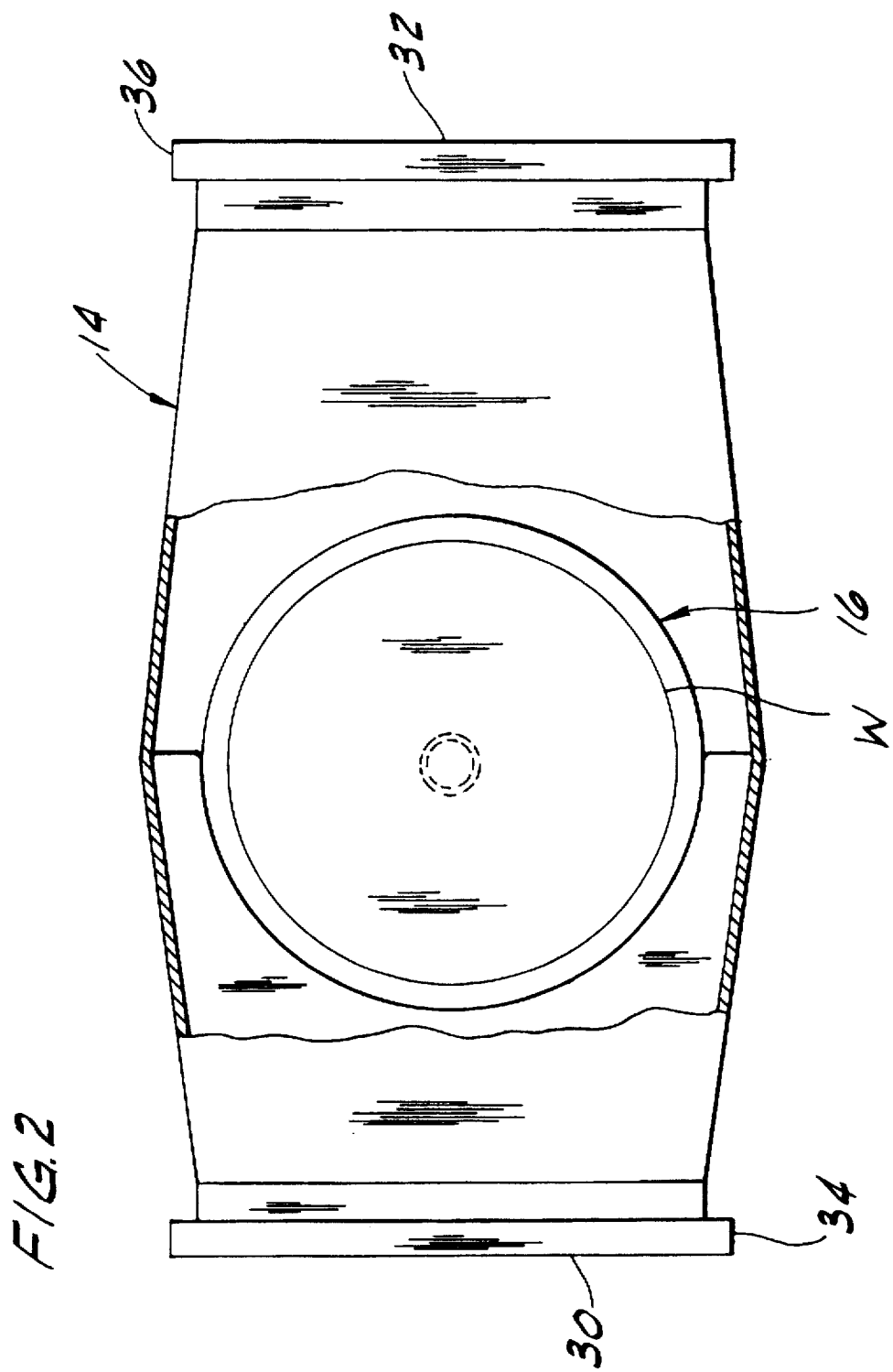
FIG. 2 is a schematic top plan of a reaction chamber of the reactor having parts broken away to show a susceptor positioned in the reaction chamber.

As shown in FIG. 2, the reaction chamber 14 is sized and shaped for receiving the semiconductor wafer W. The chamber 14 extends horizontally between an entrance 30 (FIG. 1) for admitting reactive gas to the chamber and an exit 32

(FIG. 1) for venting reactive gas from the chamber. Both the entrance 30 and exit 32 have flanges 34, 36, respectively, for releasably connecting the reaction chamber to process piping (not shown) which transports the reactive gas to and from the chamber. The wafer W is preferably inserted and removed from the chamber 14 through the entrance 30 by a robot (not shown) before and after the chemical vapor deposition process. Although other materials may be used without departing from the scope of the present invention, the reaction chamber 14 of the preferred embodiment is made of quartz.

The susceptor 16 has a circular recess 40 which forms a generally planar wafer receiving surface in the upper side of the susceptor for receiving the wafer W. The susceptor 16 is mounted on a shaft 42 which slowly rotates the susceptor during the chemical vapor deposition process to evenly distribute epitaxial material and thermal energy over the surface of the wafer W. Although the shaft 42 is illustrated as being connected directly to the susceptor, a conventional three-armed bracket (not shown) may be mounted on the upper end of the shaft for holding the susceptor. The bracket firmly supports the susceptor but only contacts the susceptor at three points to minimize heat transfer between the shaft and susceptor.

The upper and lower heating arrays 18, 20, respectively, are similar to one another. To eliminate redundancy, only the lower heating array 20 will be described in detail. The minor differences between the arrays 18, 20 will be described following the description of the lower array. Components of the upper array 18 which are similar to components of the lower array 20 are designated by similar numbers in the drawings, but will include a prime symbol to signify that they are upper array components.

Figure 3:
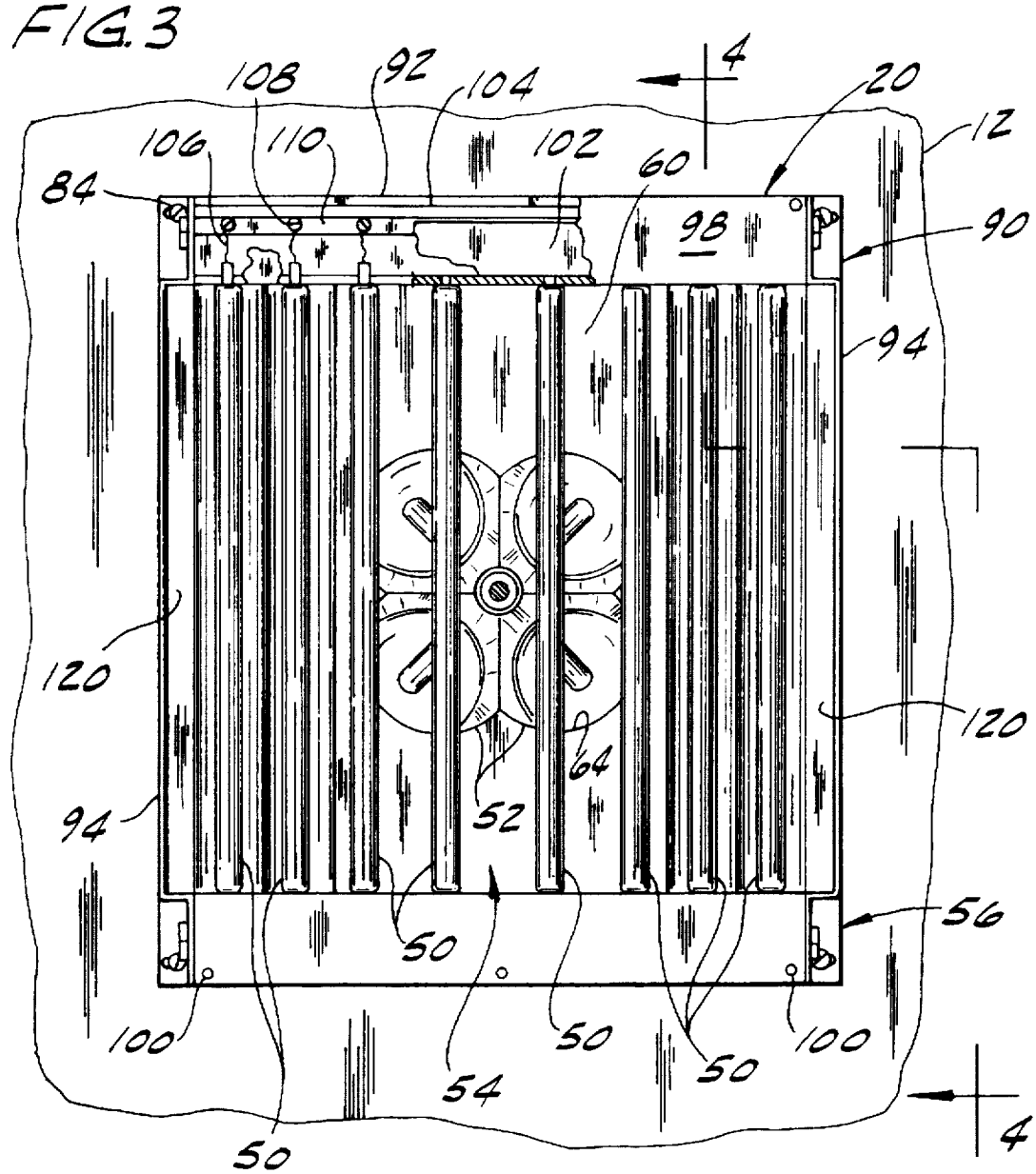
FIG. 3 is a section of the reactor taken in the plane of line 3—3 of FIG. 1, showing a lower heating array.

As illustrated in FIG. 1, the lower heating array 20 comprises eight tubular infrared heat lamps 50 arranged parallel to each other in a plane, four bulb-type infrared heat lamps 52 positioned below the tubular heat lamps, and a primary reflector (generally designated 54) for directing thermal radiation emitted by the heat lamps toward the susceptor 16 to heat the semiconductor wafer W and susceptor. The array 20 also includes a support structure, generally designated 56, for supporting the primary reflector 54 and heat lamps 50, 52. The primary reflector 54 includes two parabolic reflectors 58 which lie under the two outermost tubular heat lamps 50 on each side of the array 20, and a flat reflector 60 which lies under the four centrally-located tubular heat lamps. Slots 62 are formed in the reflector 54 under each tubular heat lamp 50 for permitting cooling air circulation around the lamps. As illustrated in FIG. 3, a cloverleaf-shaped hole 64 is formed in the center of the central reflector 60. As shown in FIG. 1, cylindrical housings 66 extend down at an angle from the reflector 60 below each lobe of the hole 64 for holding conventional bulb-type infrared heat lamp assemblies 68. The housings 66 are angled to direct thermal energy emitted by the bulb-type heat lamps 52 toward a central portion of the susceptor 16.

Figure 4:
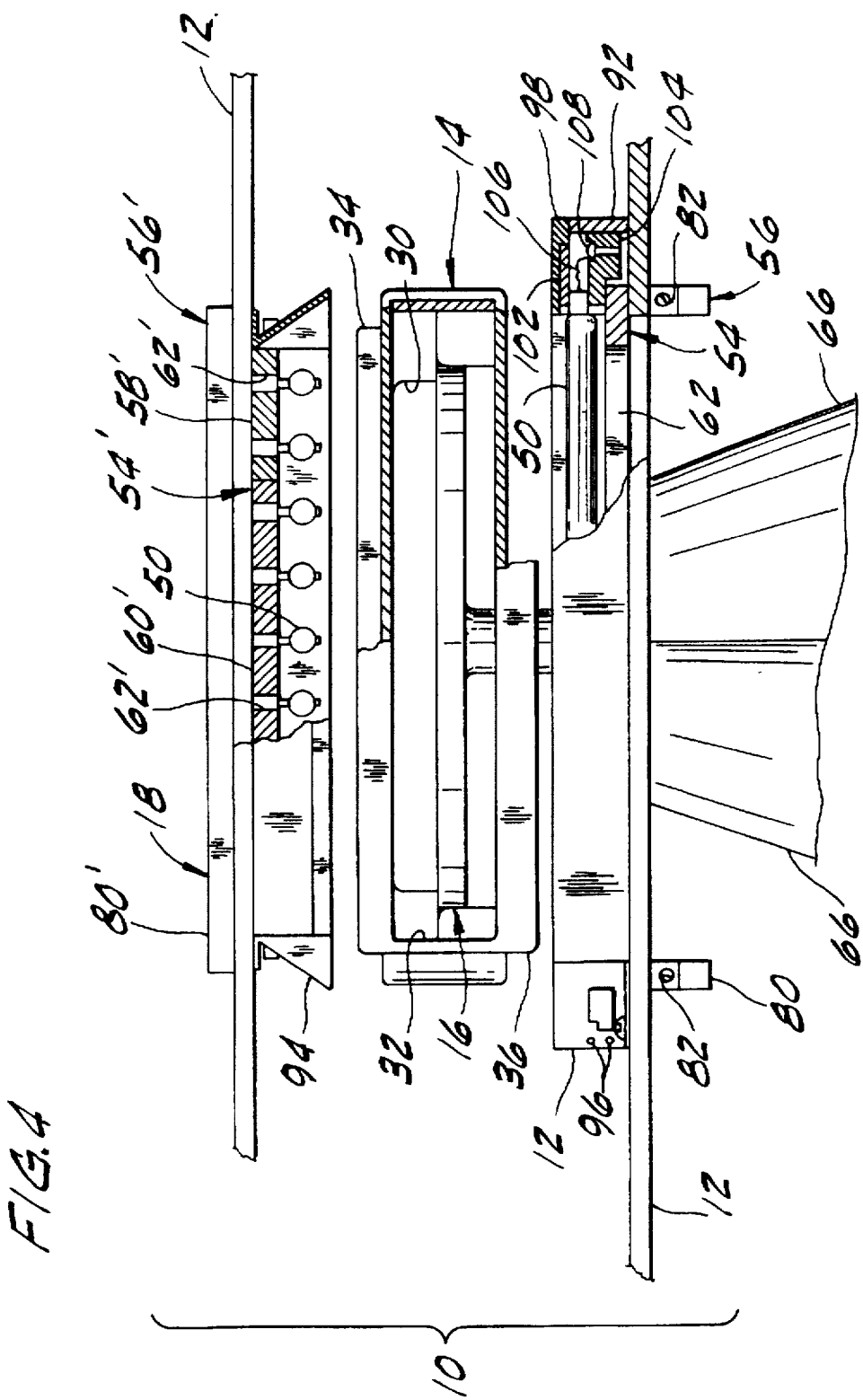
FIG. 4 is a section of the reactor taken in the plane of line 4—4 of FIG. 3.

The support structure 56 is best understood by referring to FIGS. 1, 3 and 4. The structure 56 comprises two cooling manifolds 80 which underlie the ends of the primary reflector 54. Each of the manifolds 80 has an internal passage 82 for conveying cooling water to reduce the temperature of the primary reflector 54. The manifolds 80 are attached to the enclosure 12 with screw fasteners 84 (FIG. 3), and the reflectors 58, 60 are attached to the manifolds with more screw fasteners (not shown).

As illustrated in FIG. 3, a frame, generally designated 90, surrounds the primary reflector 54 and comprises two end plates 92 (only one of which is visible) and two sheet metal secondary reflectors 94. The ends of the end plates 92 and secondary reflectors 94 are fastened together by screw fasteners 96 (FIG. 4). A cover 98 is attached to the end plates 92 with screw fasteners 100 to cover the ends of the tubular heat lamps 50. Although it is envisioned that other materials may be used without departing from the scope of the present invention, the covers 98, end plates 92 and secondary reflectors 94 of the preferred embodiment are made of aluminum. In addition, the exterior surfaces of these components are polished and gold plated to improve the thermal reflectivity which reduces their temperature and directs thermal energy toward the reaction chamber 14. As illustrated in FIG. 4, ceramic insulators 102, 104 are positioned above and below the ends of the tubular heat lamps 50. Wires 106 extending from each end of the heat lamps 50 are fastened with screws 108 to a bus 110 (FIG. 3) mounted on the insulator 104 for delivering electricity to the heat lamps when energized by a control system (not shown).

The upper heating array 18 (shown in FIGS. 1 and 4) is identical to the lower array 20 except that it holds nine tubular lamps 50' rather than eight, and it does not include bulb-type heat lamps 52 or the associated housings 66. Furthermore, the outer reflectors 58' of the upper heating array 18 are flat rather than parabolic.

Figure 5:
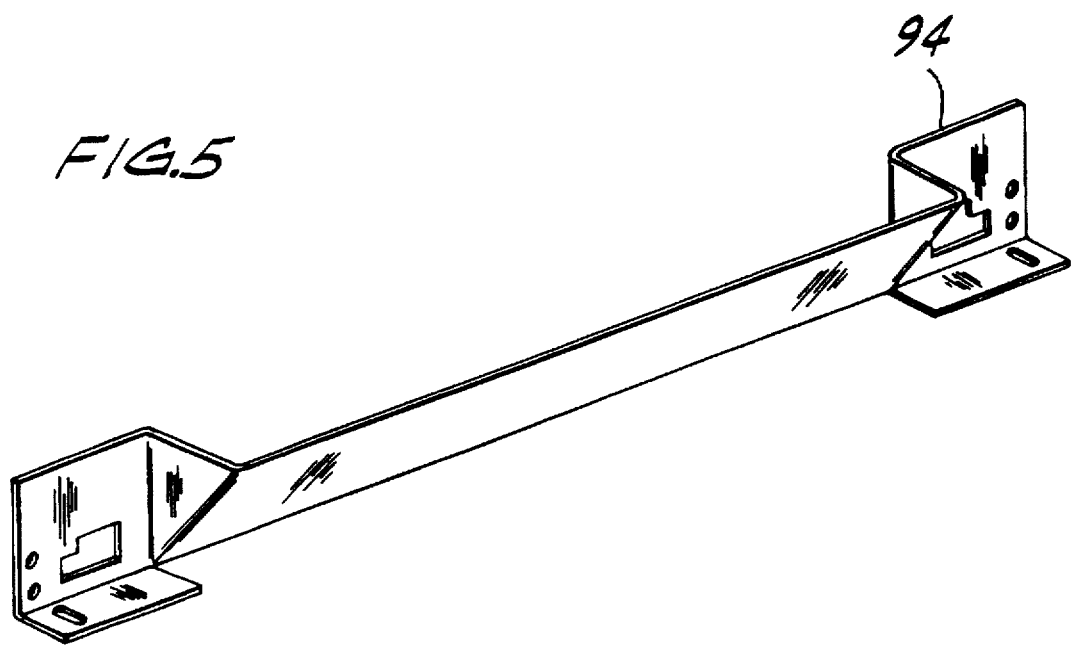
FIG. 5 is a perspective of a secondary edge reflector of the present invention.

The previously described heating arrays 18, 20 are conventional except that the lower side covers have been modified as shown in FIG. 5 to form the secondary reflectors 94, 94'. In particular, these heating arrays 18, 20 are modified Epsilon I Epitaxial Epi reactors manufactured by Advanced Semiconductor Materials America Inc. of Phoenix, Ariz. The secondary reflectors 94, 94' extend parallel to the tubular heat lamps 50 so their central portions are positioned beside the primary reflectors 58 and at least partially behind the reflective (i.e., specular) surface of the primary reflectors. Each secondary reflector 94, 94' has a specular surface 120 which is angled outward so thermal radiation emitted by the sides of the reflectors 58 and by other components is reflected toward the edge of the susceptor 16. Thus, the specular surface 120 recovers misdirected thermal radiation directed generally away from the susceptor 16 and re-directs the misdirected thermal radiation to an edge of the susceptor to heat the edge. As will be apparent to those skilled in the art, the energy reflected by the specular surface 120 reduces thermal gradients across the susceptor 16 and semiconductor wafer W to inhibit slip dislocations in the wafer during epitaxial layer deposition.

Although other configurations are envisioned as being within the scope of the present invention, the specular surface 120 of the preferred embodiment is substantially planar and lies at an angle with respect to the wafer receiving surface 40 of the susceptor 16. For example, the surface 120 may lie at an angle of between about 40° and about 80° relative to the wafer receiving surface 40 and the plane of the tubular heat lamps 50. Moreover, although other relationships are envisioned as being within the scope of the present invention, the specular surface 120 of the preferred embodiment lies at an angle of about 55° relative to the wafer receiving surface 40 of the susceptor 16 and the plane of the tubular heat lamps 50. These angles have been found to properly position the specular surfaces 120, 120' of the secondary reflectors 94, 94' to reflect radiation emitted by the sides of the reflectors 58 and by other components of the reactor 10 toward the edge of the susceptor 16 to heat the edges. Thus, the reflectors 94, 94' redirect thermal energy toward the edge of the susceptor 16 to compensate for the increased heat loss at the edge resulting from its greater surface area per unit volume.

In view of the above, it will be seen that the several objects of the invention are achieved and other advantageous results attained.

As various changes could be made in the above constructions without departing from the scope of the invention, it is intended that all matter contained in the above description or shown in the accompanying drawings shall be interpreted as illustrative and not in a limiting sense.

What is claimed is:

1. A horizontal reactor for depositing an epitaxial layer on a semiconductor wafer contained within the reactor during a chemical vapor deposition process, the reactor comprising:

a reaction chamber sized and shaped for receiving the semiconductor wafer, the chamber extending horizontally between an entrance for admitting reactive gas to the chamber and an exit for venting reactive gas from the chamber;

a susceptor having an outer edge and a generally planar wafer receiving surface positioned in the reaction chamber for supporting the semiconductor wafer during the chemical vapor deposition process;

a heating array positioned outside the reaction chamber comprising a plurality of heat lamps and a primary reflector for directing thermal radiation emitted by said plurality of heat lamps toward the susceptor to heat the semiconductor wafer and susceptor; and a secondary edge reflector having a specular surface positioned beside the heating array for recovering misdirected thermal radiation directed generally to a side of the heating array and away from the susceptor, the secondary edge reflector being shaped and arranged with respect to the heating array and the susceptor for re-directing the misdirected thermal radiation to the outer edge of the susceptor thereby to heat the edge and to reduce thermal gradients across the susceptor and the semiconductor wafer supported thereon to inhibit slip dislocations in the wafer during epitaxial layer deposition.

2. A horizontal reactor as set forth in claim 1 wherein said plurality of heat lamps comprises a plurality of tubular heat lamps arranged parallel to each other and the edge reflector extends generally parallel to said plurality of tubular heat lamps.

3. A horizontal reactor as set forth in claim 2 wherein the edge reflector has a substantially planar surface.

4. A horizontal reactor as set forth in claim 3 wherein said planar surface of the edge reflector lies at an angle of between about 40° and about 80° relative to the wafer receiving surface of the susceptor.

5. A horizontal reactor as set forth in claim 4 wherein said planar surface of the edge reflector lies at an angle of about 55° relative to the wafer receiving surface of the susceptor.

6. A horizontal reactor as set forth in claim 1 wherein the edge reflector is a first edge reflector and the reactor further comprises a second edge reflector positioned on an opposite side of the heating array from the first edge reflector.

7. A horizontal reactor as set forth in claim 6 wherein the heating array is a first heating array and the reactor further comprises a second heating array positioned outside the reaction chamber on an opposite side of the reactor from the first heating array, the second heating array comprising a plurality of heat lamps and a primary reflector for directing thermal radiation emitted by said plurality of heat lamps toward the susceptor to heat the semiconductor wafer and susceptor.

8. A horizontal reactor as set forth in claim 7 further comprising third and fourth edge reflectors positioned on opposite sides of said second heating array, each of said third and fourth reflectors having a specular surface positioned beside the second heating array for recovering misdirected thermal radiation directed generally to a side of the second heating array and away from the susceptor, the third and fourth edge reflectors being shaped and arranged with respect to the second heating array and the susceptor for re-directing the misdirected thermal radiation to the outer edge of the susceptor thereby to heat the edge and to reduce thermal gradients across the susceptor and the semiconductor wafer.

9. A heating array for use in combination with a horizontal reactor for depositing an epitaxial layer on a semiconductor wafer held by a susceptor in the reactor during a chemical vapor deposition process, the heating array comprising:

heat lamps;

a reflector for directing thermal radiation emitted by the heat lamps toward the susceptor to heat the semiconductor wafer and susceptor; and a support structure for supporting the reflector and heat lamps and for holding the reflector and heat lamps in position, the structure including a specular surface for recovering misdirected thermal radiation directed generally away from the susceptor, the specular surface being shaped and arranged with respect to the heating array and the susceptor for re-directing the misdirected thermal radiation to an edge of the susceptor thereby to heat the edge and to reduce thermal gradients across the susceptor and the semiconductor wafer supported thereon to inhibit slip dislocations in the wafer during epitaxial layer deposition.

10. A heating array as set forth in claim 9 wherein the heat lamps are arranged in a plane and the specular surface is substantially planar.

11. A heating array as set forth in claim 10 wherein the specular surface lies at an angle of between about 40° and about 80° relative to said plane of heat lamps.

12. A heating array as set forth in claim 11 wherein the specular surface lies at an angle of about 55° relative to said plane of heat lamps.

13. A heating assembly for use in combination with a horizontal reactor for depositing an epitaxial layer on a semiconductor wafer held by a susceptor in the reactor during a chemical vapor deposition process, the assembly comprising:

a heat lamp;

a primary reflector positioned adjacent the heat lamp for directing thermal radiation emitted by the heat lamp toward the susceptor to heat the semiconductor wafer and susceptor; and a secondary reflector having a specular surface positioned adjacent the primary reflector for recovering misdirected thermal radiation emitted by the primary reflector and directed generally away from the susceptor, the secondary edge reflector being shaped and arranged with respect to the heating array and the susceptor for re-directing the misdirected thermal radiation to the susceptor.

14. A heating array as set forth in claim 13 wherein the secondary edge reflector is at least partially behind a specular surface of the primary reflector.

* * * * *